(12) United States Patent
Anderson et al.

(10) Patent No.: US 7,537,941 B2
(45) Date of Patent: May 26, 2009

(54) VARIABLE OVERLAP OF DUMMY SHAPES FOR IMPROVED RAPID THERMAL ANNEAL UNIFORMITY

(75) Inventors: Brent A. Anderson, Jericho, VT (US); Howard S. Landis, Underhill, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 385 days.

(21) Appl. No.: 11/422,622

(22) Filed: Jun. 7, 2006

(65) Prior Publication Data
US 2007/0287200 A1      Dec. 13, 2007

(51) Int. Cl.
*H01L 21/66* (2006.01)
(52) U.S. Cl. .................. 438/14; 438/7; 438/10; 438/18; 257/E21.521; 257/E21.53
(58) Field of Classification Search ............ 438/11, 438/54; 257/E21.522, E21.529
See application file for complete search history.

(56) References Cited

U.S. PATENT DOCUMENTS

| 5,336,641 | A | 8/1994 | Fair et al. |
| 5,756,369 | A | 5/1998 | Aronowitz et al. |
| 2001/0040156 | A1 | 11/2001 | Tay et al. |
| 2002/0019148 | A1 | 2/2002 | Hawryluk et al. |
| 2003/0155072 | A1* | 8/2003 | Lee et al. ............ 156/345.24 |
| 2004/0188801 | A1 | 9/2004 | Ehrichs |

* cited by examiner

*Primary Examiner*—Walter L Lindsay, Jr.
*Assistant Examiner*—Cheung Lee
(74) *Attorney, Agent, or Firm*—Gibb I.P. Law Firm, LLC; Richard M. Kotulak, Esq

(57) ABSTRACT

Embodiments of the invention provide a method, structure, service, etc. for variable overlap of dummy shapes for improved rapid thermal anneal uniformity. A method of providing uniform temperatures across a limited region of a wafer during a rapid thermal anneal process comprises determining a first reflectivity in a first portion of the limited region by measuring a density of first structures in the first portion. Next, the method determines a second reflectivity in a second portion of the limited region by measuring a density of second structures in the second portion. Specifically, the first structures comprise diffusion fill shapes and polysilicon conductor fill shapes (non-active dummy structures); and, the second structures comprise active circuit structures.

28 Claims, 4 Drawing Sheets

VARIABLE OVERLAP OF DUMMY SHAPES FOR IMPROVED RAPID THERMAL ANNEAL UNIFORMITY

BACKGROUND

1. Field of the Invention

Embodiments of the invention provide a method, structure, service, etc. for variable overlap of dummy shapes for improved rapid thermal anneal uniformity.

2. Description of the Related Art

Large threshold voltage (Vt) variations are found in 10S and 11S technologies. Detailed analysis shown that the cause is not Across Chip Linewidth Varaition (ACLV); instead traced to large systematic across field Vt variation. Source identified as Rapid Thermal Anneal (RTA).

Advanced semiconductor technologies require relatively sharp and shallow junctions. This forces implant diffusion and activation anneals to use very high temperatures and very short durations. Infrared RTA processes are commonly used apply this sort of spike anneal. Local variations in the reflectivity of the surface of a wafer affect the amount of radiated light absorbed by the wafer, which in turn affects the maximum temperature and the time at temperature. These variations in the local annealing conditions act to degrade the device characteristics, in some cases more severely than ACLV. The infrared (IR) reflectivity of a wafer surface is known to be strongly correlated to the local fraction of the surface not covered by diffusion (also referred to herein as "RX") or polysilicon (also referred to herein as "PC") features. Regions not covered by RX or PC are referred to as Shallow Trench Isolation (STI) regions. Although STI density variations occur over many distance ranges, RTA variations are known to operate over fairly large distances, typically 4 mm radius, because of the high thermal conductivity of a standard semiconductor wafer.

Dummy FILL shapes are used in the semiconductor industry to reduce the variation in local density for RX and PC features. These dummy features are primarily used to improve the manufacturing process window for the RX and PC process modules. For RX, the primary yield limiter addressed by RXFILL is Chemical-Mechanical Polish (CMP) planarization. For PC, the primary yield limiter addressed by PCFILL is linewidth variation. Although it would be useful to reduce STI density variations for improved RTA uniformity, normally it would not be possible to affect the STI density without also changing the RX or PC local density, or both.

SUMMARY

Embodiments of the invention provide a method, structure, service, etc. for variable overlap of dummy shapes for improved rapid thermal anneal uniformity. A method of providing uniform temperatures across a limited region of a wafer during a rapid thermal anneal process comprises determining a first reflectivity in a first portion of the limited region by measuring a density of first structures in the first portion. Next, the method determines a second reflectivity in a second portion of the limited region by measuring a density of second structures in the second portion. Specifically, the first structures comprise diffusion fill shapes and polysilicon conductor fill shapes (non-active, non-switching dummy structures); and, the second structures comprise active circuit structures.

The first reflectivity and the second reflectivity are then compared. Following this, the method adjusts an amount of overlap of the first structures in the first portion, adjusts sizes and/or shapes of the first structures, inserts films into the first portion, and/or removes films from the first portion. This balances the first reflectivity of the first portion and the second reflectivity of the second portion, which balances a first temperature of the first portion and a second temperature of the second portion during the rapid thermal anneal process.

More specifically, the adjusting of the amount of overlap of the first structures comprises completely overlapping the first structures, partially overlapping the first structures, and/or adjusting the first structures such that the first structures do not overlap. Further, the adjusting of the amount of overlap of the first structures, the adjusting of the sizes and/or shapes of the first structures, the inserting of the films into the first portion, and/or the removing of the films from the first portion avoids changing a density of the first structures and adjusts an amount of radiated light absorbed by the first portion.

A semiconductor structure of embodiments herein comprises a first portion comprising a first density of first structures and a second portion comprising a second density of second structures. Specifically, the first structures comprise diffusion fill shapes and polysilicon conductor fill shapes; and the second structures comprise active circuit structures.

The first structures have an amount of overlap ranging from completely overlapped, partially overlapped, to not overlapped. The amount of overlap balances the first density and the second density, wherein the first density and the second density balances a temperature across the semiconductor structure during rapid thermal annealing processes. The structure further comprises a density of films in the first portion, wherein the density of films and/or the sizes and/or shapes of the first structures balance the first density and the second density.

Accordingly, excellent correlation is shown between local RTA temperature and exposed STI density. Exposed STI density can be measured and controlled without affecting critical RX and PC density by adjusting the amount of overlap between RX and PC fill shapes. Methods can be used to calculate the reflectance and optimize for each parameter.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
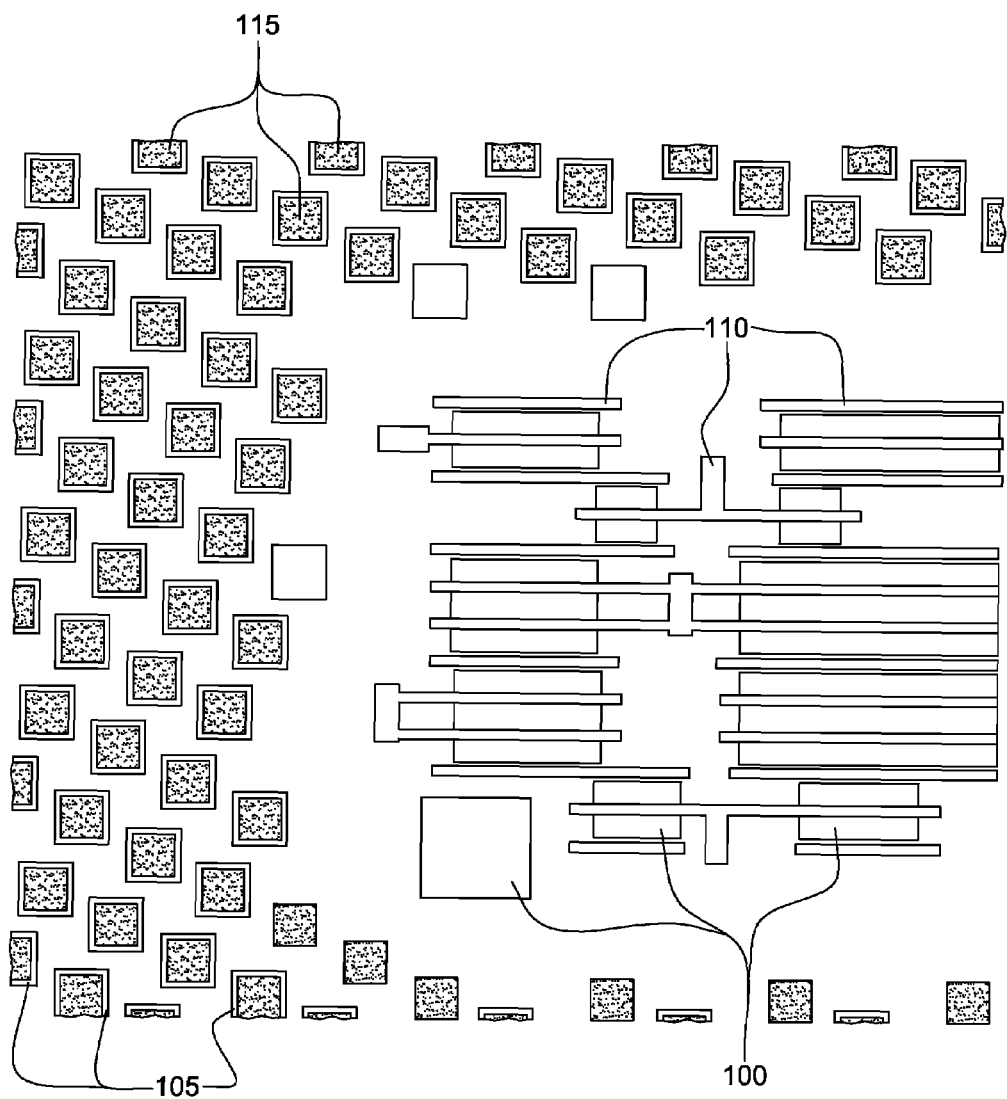
FIG. 1 illustrates a semiconductor structure showing completely overlapped diffusion fill shapes and polysilicon conductor fill shapes.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Excellent correlation is shown between local RTA temperature and exposed STI density. Exposed STI density can be measured and controlled without affecting critical RX and PC density by adjusting the amount of overlap between RX and PC fill shapes. Methods can be used to calculate the reflectance and optimize for each parameter.

It is possible to modulate the STI density—without changing either the RX or PC local densities—by using RXFILL and PCFILL shapes that are not fully overlapped in the normal way. In this manner it is possible to vary the STI density with and across a semiconductor design, so as to reduce the long-range (nominally 4 mm) variations that drive RTA variations, without affecting either the RX or the PC local densities.

By utilizing this technique in conjunction with information about the long-range STI densities, design dummy RXFILL and dummy PCFILL shapes that will reduce RTA variations without sacrificing any of the benefits normally provided by dummy shapes on these levels can be automatically generated and placed within a semiconductor. Such a tool could be used to improve the device characteristics of any semiconductor design with no adverse effects.

The following steps can be used to implement the invention described above on any conventional semiconductor design. First, RXFILL and PCFILL shapes are generated in the usual fashion. Next, the resulting STI density is measured over the length scale of interest (e.g., nominally 4 mm radius). Third, for each small region of the design, the generated PCFILL shapes are offset with respect to the generated RXFILL shapes in such a manner that the total STI density variation over the length scale of interest is reduced.

Following this, Mask and Device manufacturing is proceeded in the normal fashion. The best results can be achieved if the size of the adjustment regions in the third step is much smaller than the RTA length scale of interest (nominally 4 mm). This approach is compatible with advanced RXFILL and/or PCFILL methods that use variably-sized dummy fill shapes.

Furthermore, the total reflectivity within a region can also be manipulated by adjusting the size and/or the number of RX and/or RXFILL shapes in that region. And the total reflectivity within a region can also be manipulated by adjusting the size and/or the number of PC and/or PCFILL shapes in that region. In addition, the total reflectivity in a specific region can be manipulated by the presence or absence of other covering films in that region, such as nitride capping films that may be used to block certain implants during the course of the steps that discriminate nFET regions from pFET regions. In addition, the total reflectivity in a region can be adjusted by the use of an ad hoc film or set of films intended solely for this purpose.

Figure 2:
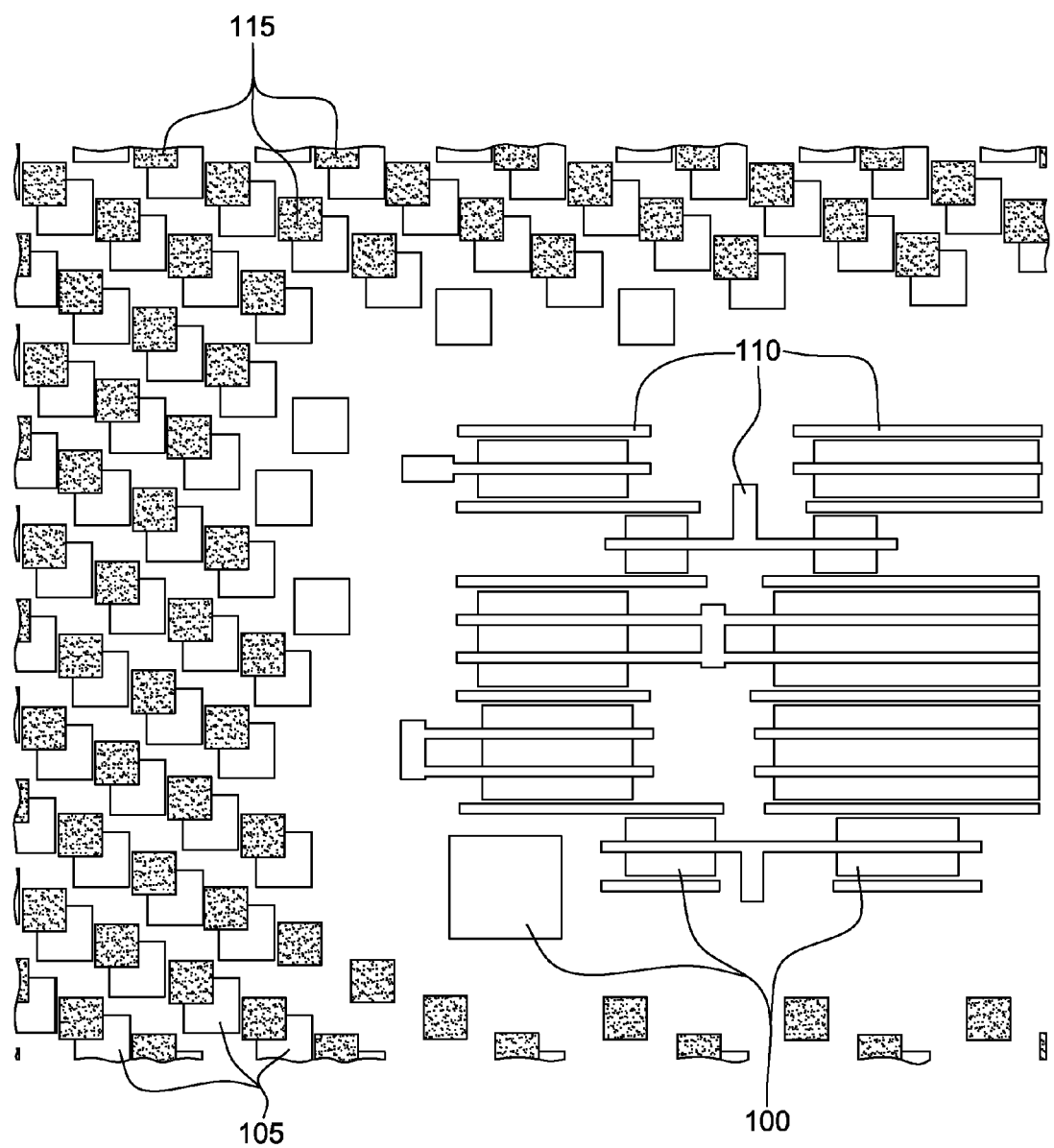
FIG. 2 illustrates a semiconductor structure showing partially overlapped diffusion fill shapes and polysilicon conductor fill shapes.
Figure 3:
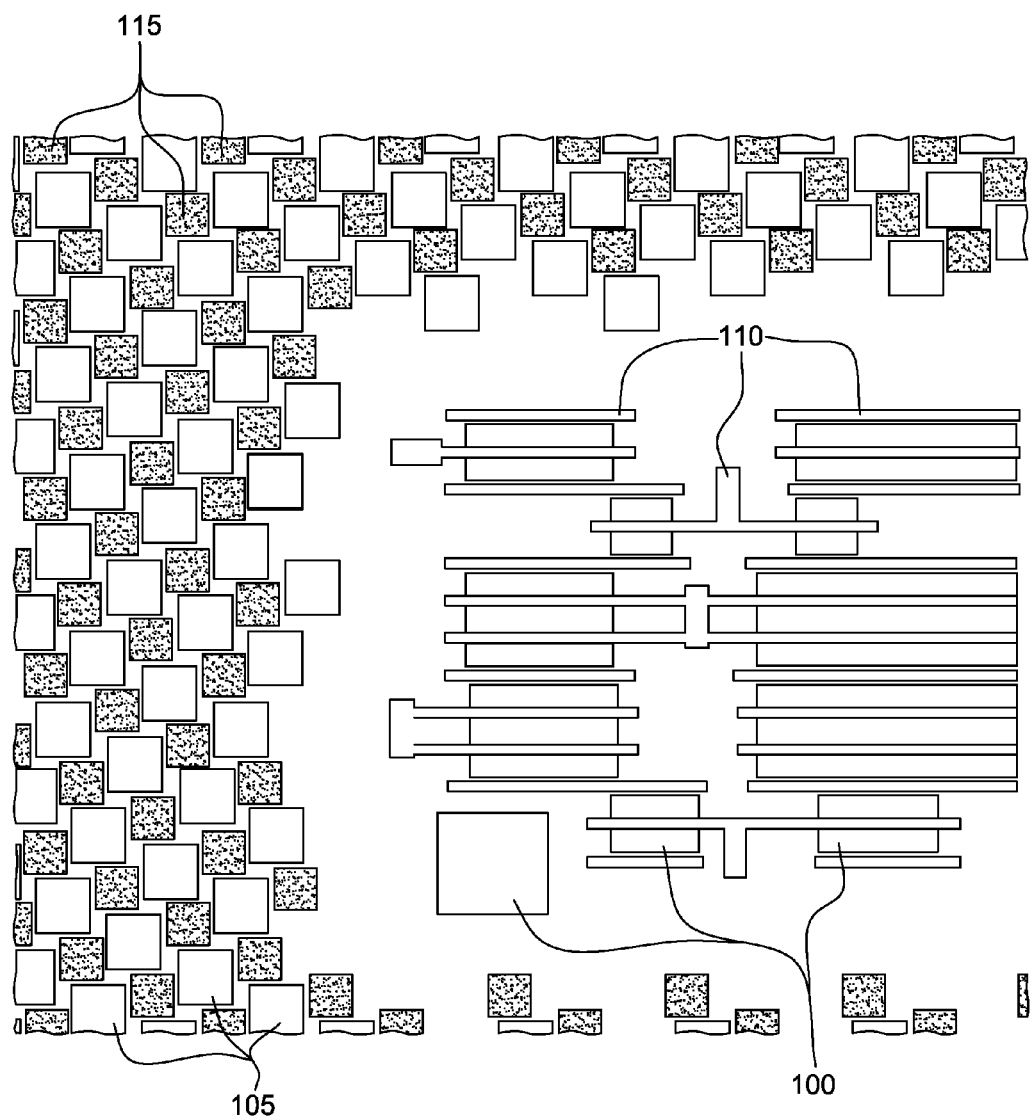
FIG. 3 illustrates a semiconductor structure showing diffusion fill shapes and polysilicon conductor fill shapes that are not overlapped.

FIG. 1-3 illustrate semiconductor structures for variable overlap of dummy shapes for improved rapid thermal anneal uniformity, comprising RX features 100 and PC features 110. More specifically, FIG. 1 illustrates RXFILL shapes (i.e., diffusion fill shapes) 105 and PCFILL shapes (i.e., polysilicon conductor fill shapes) 115 that are completely overlapped. Furthermore, FIG. 2 illustrates RXFILL shapes 105 and PCFILL shapes 115 that are partially overlapped; and FIG. 3 illustrates RXFILL shapes 105 and PCFILL shapes 115 that are not overlapped.

Thus, embodiments of the invention provide a method, structure, service, etc. for variable overlap of dummy shapes for improved rapid thermal anneal uniformity. A method of providing uniform temperatures across a limited region of a wafer during a rapid thermal anneal process comprises determining a first reflectivity in a first portion of the limited region by measuring a density of first structures in the first portion. Next, the method determines a second reflectivity in a second portion of the limited region by measuring a density of second structures in the second portion. As described above, local variations in the reflectivity of the surface of a wafer affect the amount of radiated light absorbed by the wafer, which in turn affects the maximum temperature and the time at temperature. These variations in the local annealling conditions act to degrade the device characteristics, in some cases more severely than Across Chip Linewidth Varaition (ACLV).

The first structures comprise non-active dummy structures, and more specifically, diffusion fill shapes (i.e., RXFILL shapes 105) and polysilicon conductor fill shapes (i.e., PCFILL shapes 115). The second structures comprise active circuit structures. As described above, the dummy FILL shapes are used to reduce the variation in local density for RX and PC features. These dummy features are primarily used to improve the manufacturing process window for the RX and PC process modules.

The first reflectivity and the second reflectivity are then compared. As described above, the IR reflectivity of a wafer surface is known to be strongly correlated to the local fraction of the surface not covered by diffusion (RX) or polysilicon (PC) features. Regions not covered by RX or PC are referred to as Shallow Trench Isolation (STI) regions.

Following this, the method adjusts an amount of overlap of the first structures in the first portion, adjusts sizes and/or shapes of the first structures, inserts films into the first portion, and/or removes films from the first portion. This balances the first reflectivity of the first portion and the second reflectivity of the second portion, which balances a first temperature of the first portion and a second temperature of the second portion during the rapid thermal anneal process. As described above, for each small region of the design, the PCFILL shapes are offset with respect to the RXFILL shapes in such a manner that the total STI density variation over the length scale of interest is reduced.

More specifically, as illustrated in FIGS. 1-3, the adjusting of the amount of overlap of the first structures comprises completely overlapping the first structures, partially overlapping the first structures, and/or adjusting the first structures such that the first structures do not overlap. Further, the adjusting of the amount of overlap of the first structures, the adjusting of the sizes and/or shapes of the first structures, the inserting of the films into the first portion, and/or the removing of the films from the first portion avoids changing a density of the first structures and adjusts an amount of radiated light absorbed by the first portion. As described above, in this manner it is possible to vary the STI density with and across a semiconductor design, so as to reduce the long-range (nominally 4 mm) variations that drive RTA variations.

Embodiments herein further provide a semiconductor structure comprising a first portion comprising a first density of first structures and a second portion comprising a second density of second structures. Specifically, the first structures comprise diffusion fill shapes (i.e., RXFILL shapes 105) and polysilicon conductor fill shapes (i.e., PCFILL shapes 115); and, the second structures comprise active circuit structures. As described above, the dummy FILL shapes are used to reduce the variation in local density for RX and PC features. These dummy features are primarily used to improve the manufacturing process window for the RX and PC process modules.

As illustrated in FIGS. 1-3, the first structures have an amount of overlap ranging from completely overlapped, partially overlapped, to not overlapped. The amount of overlap balances the first density and the second density, wherein the first density and the second density balances a temperature across the semiconductor structure during rapid thermal annealing processes. The structure further comprises a density of films in the first portion, wherein the density of films and/or the sizes and/or shapes of the first structures balance the first density and the second density. As described above, the IR reflectivity of a wafer surface is known to be strongly correlated to the local fraction of the surface not covered by diffusion (RX) or polysilicon (PC) features. Moreover, local variations in the reflectivity of the surface of a wafer affect the amount of radiated light absorbed by the wafer, which in turn affects the maximum temperature and the time at temperature.

Figure 4:
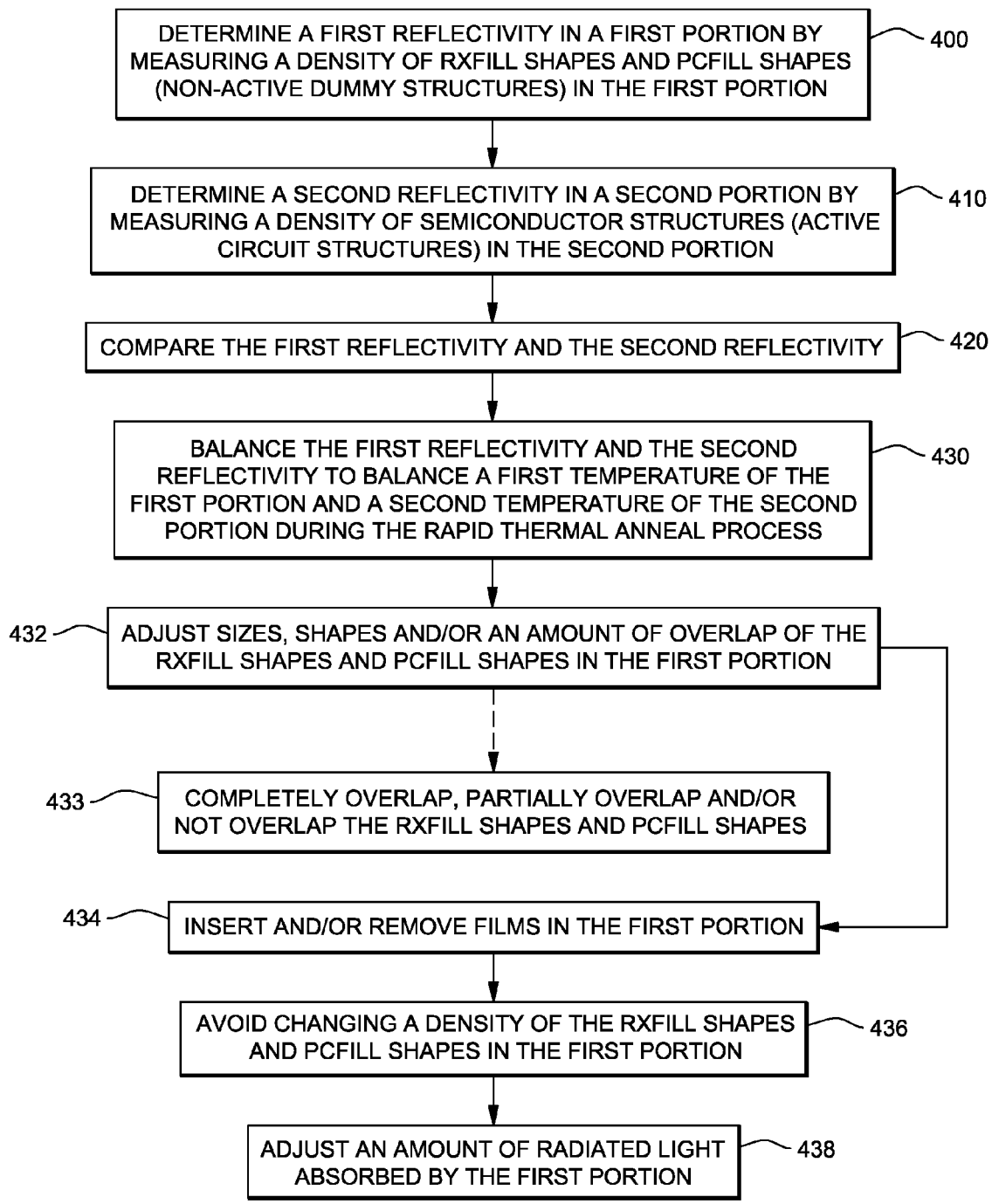
FIG. 4 is a flow diagram of a method and service for variable overlap of dummy shapes for improved rapid thermal anneal uniformity.

FIG. 4 illustrates a method and service for variable overlap of dummy shapes for improved rapid thermal anneal uniformity. The method begins in item 400 by determining a first reflectivity in a first portion of a limited region by measuring a density of RXFILL shapes and PCFILL shapes (non-active dummy structures) in the first portion. Next, in item 410, the method determines a second reflectivity in a second portion of the limited region by measuring a density of semiconductor structures (active circuit structures) in the second portion. As described above, local variations in the reflectivity of the surface of a wafer affect the amount of radiated light absorbed by the wafer, which in turn affects the maximum temperature and the time at temperature. These variations in the local annealling conditions act to degrade the device characteristics, in some cases more severely than Across Chip Linewidth Varaition (ACLV).

In item 420, the first reflectivity and the second reflectivity are compared. As described above, the IR reflectivity of a wafer surface is known to be strongly correlated to the local fraction of the surface not covered by diffusion (RX) or polysilicon (PC) features. Regions not covered by RX or PC are referred to as Shallow Trench Isolation (STI) regions. Following this, in item 430, the method balances the first reflectivity of the first portion and the second reflectivity of the second portion to balance a first temperature of the first portion and a second temperature of the second portion during the rapid thermal anneal process.

More specifically, the balancing in item 430 comprises adjusting sizes, shapes and/or an amount of overlap of the RXFILL shapes and PCFILL shapes in the first portion (item 432). This may involve completely overlapping, partially overlapping and/or not overlapping the RXFILL shapes and PCFILL shapes (item 433). As described above, for each small region of the design, the PCFILL shapes are offset with respect to the RXFILL shapes in such a manner that the total STI density variation over the length scale of interest is reduced. The method further comprises inserting and/or removing films in the first portion (item 434). In addition, the method avoids changing a density of the diffusion fill shapes and polysilicon conductor fill shapes in the first portion (item 436) and adjusts an amount of radiated light absorbed by the first portion (item 438). As described above, in this manner it is possible to vary the STI density with and across a semiconductor design, so as to reduce the long-range (nominally 4 mm) variations that drive RTA variations.

Accordingly, excellent correlation is shown between local RTA temperature and exposed STI density. Exposed STI density can be measured and controlled without affecting critical RX and PC density by adjusting the amount of overlap between RX and PC fill shapes. Methods can be used to calculate the reflectance and optimize for each parameter.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method of providing uniform temperatures across a region of a wafer during a rapid thermal anneal process, said method comprising:
    determining a first reflectivity in a first portion of said region by measuring a density of first structures in said first portion;
    determining a second reflectivity in a second portion of said region by measuring a density of second structures in said second portion;
    comparing said first reflectivity and said second reflectivity; and
    adjusting an amount of overlap of said first structures in said first portion to balance said first reflectivity of said first portion and said second reflectivity of said second portion.

2. The method according to claim 1, wherein said adjusting of said amount of overlap of said first structures comprises at least one of completely overlapping said first structures, partially overlapping said first structures, and adjusting said first structures such that said first structures do not overlap.

3. The method according to claim 1, wherein said adjusting of said amount of overlap of said first structures comprises adjusting an amount of overlap of diffusion fill shapes and polysilicon conductor fill shapes.

4. The method according to claim 1, wherein said second structures comprise active circuit structures, and said first structures comprise non-active dummy structures.

5. The method according to claim 1, wherein said balancing of said first reflectivity of said first portion and said second reflectivity of said second portion balances a first temperature of said first portion and a second temperature of said second portion during said rapid thermal anneal process.

6. The method according to claim 1, wherein said adjusting of said amount of overlap of said first structures avoids changing a density of said first structures in said first portion.

7. The method according to claim 1, wherein said adjusting of said amount of overlap of said first structures adjusts an amount of radiated light absorbed by said first portion.

8. The method according to claim 1, further comprising performing at least one of adjusting sizes of said first structures in said first portion, adjusting shapes of said first structures in said first portion, inserting films into said first portion, and removing films from said first portion to balance said first reflectivity of said first portion and said second reflectivity of said second portion.

9. A method of providing uniform temperatures across a limited region of a wafer during a rapid thermal anneal process, said method comprising:
determining a first reflectivity in a first portion of said limited region by measuring a density of diffusion fill shapes and polysilicon conductor fill shapes in said first portion;
determining a second reflectivity in a second portion of said limited region by measuring a density of semiconductor structures in said second portion;
comparing said first reflectivity and said second reflectivity; and
adjusting an amount of overlap of said diffusion fill shapes and polysilicon conductor fill shapes in said first portion to balance said first reflectivity of said first portion and said second reflectivity of said second portion.

10. The method according to claim 9, wherein said adjusting of said amount of overlap of said diffusion fill shapes and polysilicon conductor fill shapes comprises at least one of completely overlapping said diffusion fill shapes and polysilicon conductor fill shapes, partially overlapping said diffusion fill shapes and polysilicon conductor fill shapes, and adjusting said first structures such that said diffusion fill shapes and polysilicon conductor fill shapes do not overlap.

11. The method according to claim 9, wherein said semiconductor structures comprise active circuit structures, and said diffusion fill shapes and polysilicon conductor fill shapes comprise non-active dummy structures.

12. The method according to claim 9, wherein said balancing of said first reflectivity of said first portion and said second reflectivity of said second portion balances a first temperature of said first portion and a second temperature of said second portion during said rapid thermal anneal process.

13. The method according to claim 9, wherein said adjusting of said amount of overlap of said diffusion fill shapes and polysilicon conductor fill shapes avoids changing a density of said diffusion fill shapes and polysilicon conductor fill shapes in said first portion.

14. The method according to claim 9, wherein said adjusting of said amount of overlap of said diffusion fill shapes and polysilicon conductor fill shapes adjusts an amount of radiated light absorbed by said first portion.

15. The method according to claim 9, further comprising performing at least one of adjusting sizes of at least one of said diffusion fill shapes and said polysilicon conductor fill shapes, adjusting shapes of at least one of said diffusion fill shapes and said polysilicon conductor fill shapes, inserting films into said first portion, and removing films from said first portion to balance said first reflectivity of said first portion and said second reflectivity of said second portion.

16. A method of providing uniform temperatures across a limited region of a wafer during a rapid thermal anneal process, said method comprising:
determining a first reflectivity in a first portion of said limited region by measuring a density of first structures in said first portion, wherein said first structures comprise non-active dummy structures;
determining a second reflectivity in a second portion of said limited region by measuring a density of second structures in said second portion, wherein said second structures comprise active circuit structures;
comparing said first reflectivity and said second reflectivity; and
performing at least one of adjusting an amount of overlap of said first structures in said first portion, adjusting sizes of said first structures in said first portion, adjusting shapes of said first structures in said first portion, inserting films into said first portion, and removing films from said first portion to balance said first reflectivity of said first portion and said second reflectivity of said second portion.

17. The method according to claim 16, wherein said adjusting of said amount of overlap of said first structures comprises adjusting an amount of overlap of diffusion fill shapes and polysilicon conductor fill shapes.

18. The method according to claim 16, wherein said balancing of said first reflectivity of said first portion and said second reflectivity of said second portion balances a first temperature of said first portion and a second temperature of said second portion during said rapid thermal anneal process.

19. The method according to claim 16, wherein said adjusting of said amount of overlap of said first structures, said adjusting of said sizes of said first structures, said adjusting of said shapes of said first structures, said inserting of said films into said first portion, and said removing of said films from said first portion adjusts an amount of radiated light absorbed by said first portion.

20. The method according to claim 16, wherein said adjusting of said amount of overlap of said first structures, said adjusting of said sizes of said first structures, said adjusting of said shapes of said first structures, said inserting of said films into said first portion, and said removing of said films from said first portion avoids changing a density of said first structures in said first portion.

21. A service of providing uniform temperatures across a limited region of a wafer during a rapid thermal anneal process, said service comprising:
determining a first reflectivity in a first portion of said limited region by measuring a density of first structures in said first portion;
determining a second reflectivity in a second portion of said limited region by measuring a density of second structures in said second portion;
comparing said first reflectivity and said second reflectivity; and
adjusting an amount of overlap of said first structures in said first portion to balance said first reflectivity of said first portion and said second reflectivity of said second portion.

22. The service according to claim 21, wherein said adjusting of said amount of overlap of said first structures comprises at least one of completely overlapping said first structures, partially overlapping said first structures, and adjusting said first structures such that said first structures do not overlap.

23. The service according to claim 21, wherein said adjusting of said amount of overlap of said first structures comprises adjusting an amount of overlap of diffusion fill shapes and polysilicon conductor fill shapes.

24. The service according to claim 21, wherein said second structures comprise active circuit structures, and said first structures comprise non-active dummy structures.

25. The service according to claim 21, wherein said balancing of said first reflectivity of said first portion and said second reflectivity of said second portion balances a first temperature of said first portion and a second temperature of said second portion during said rapid thermal anneal process.

26. The service according to claim 21, wherein said adjusting of said amount of overlap of said first structures avoids changing a density of said first structures in said first portion.

27. The service according to claim 21, wherein said adjusting of said amount of overlap of said first structures adjusts an amount of radiated light absorbed by said first portion.

28. The service according to claim 21, further comprising performing at least one of adjusting sizes of said first structures in said first portion, adjusting shapes of said first structures in said first portion, inserting films into said first portion, and removing films from said first portion to balance said first reflectivity of said first portion and said second reflectivity of said second portion.

* * * * *